(12) United States Patent
Horiguchi et al.

(10) Patent No.: US 9,436,085 B2
(45) Date of Patent: Sep. 6, 2016

(54) COMPOSITION FOR FORMING PHOTOSENSITIVE RESIST UNDERLAYER FILM

(75) Inventors: Yusuke Horiguchi, Toyama (JP); Makiko Umezaki, Toyama (JP); Noriaki Fujitani, Toyama (JP); Hirokazu Nishimaki, Toyama (JP); Takahiro Kishioka, Toyama (JP); Takahiro Hamada, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 35 days.

(21) Appl. No.: 13/516,304

(22) PCT Filed: Dec. 6, 2010

(86) PCT No.: PCT/JP2010/071816
§ 371 (c)(1),
(2), (4) Date: Jun. 15, 2012

(87) PCT Pub. No.: WO2011/074433
PCT Pub. Date: Jun. 23, 2011

(65) Prior Publication Data
US 2012/0251950 A1 Oct. 4, 2012

(30) Foreign Application Priority Data
Dec. 16, 2009 (JP) ................. 2009-285573

(51) Int. Cl.
G03F 7/09 (2006.01)
G03F 7/30 (2006.01)
G03F 7/32 (2006.01)
C08F 12/24 (2006.01)
C08F 212/14 (2006.01)
C08F 220/56 (2006.01)
G03F 7/038 (2006.01)

(52) U.S. Cl.
CPC ............... *G03F 7/091* (2013.01); *C08F 12/24* (2013.01); *C08F 212/14* (2013.01); *C08F 220/56* (2013.01); *G03F 7/038* (2013.01); *G03F 7/30* (2013.01); *G03F 7/322* (2013.01)

(58) Field of Classification Search
None
See application file for complete search history.

(56) References Cited

U.S. PATENT DOCUMENTS

| 6,156,479 | A | 12/2000 | Meador et al. | |
|---|---|---|---|---|
| 2002/0058201 | A1* | 5/2002 | Miyaji et al. | 430/270.1 |
| 2005/0255410 | A1 | 11/2005 | Guerrero et al. | |
| 2006/0063105 | A1* | 3/2006 | Oberlander et al. | 430/270.1 |
| 2007/0072109 | A1* | 3/2007 | Makii et al. | 430/270.1 |
| 2007/0105040 | A1 | 5/2007 | Toukhy et al. | |
| 2007/0117049 | A1 | 5/2007 | Guerrero et al. | |

(Continued)

FOREIGN PATENT DOCUMENTS

| JP | A-10-213904 | 8/1998 |
|---|---|---|
| JP | A-2004-54286 | 2/2004 |

(Continued)

OTHER PUBLICATIONS

Dec. 28, 2010 Written Opinion of the International Searching Authority issued in International Application No. PCT/JP2010/071816 (with translation).

(Continued)

*Primary Examiner* — Cynthia H Kelly
*Assistant Examiner* — Alyssa Cepluch
(74) *Attorney, Agent, or Firm* — Oliff PLC

(57) ABSTRACT

A composition for forming a resist underlayer film to be used in a lithography process, that includes: a polymer containing unit structures of Formula (1), Formula (2), and Formula (3):

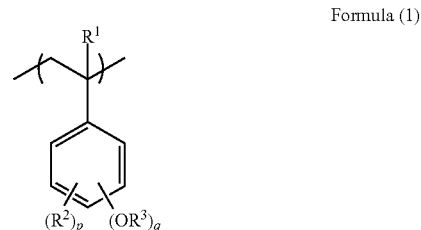

Formula (1)

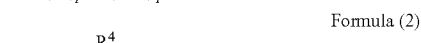

Formula (2)

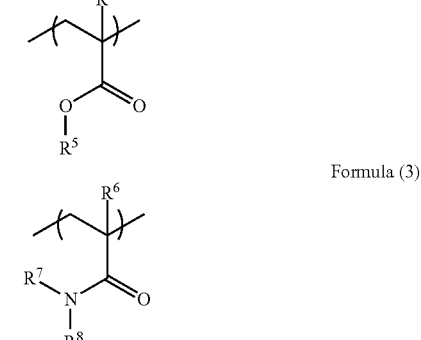

Formula (3)

the polymer being a polymer in which the unit structure of Formula (1) has a ratio of mole number (a) within a range of $0.20 \leq a \leq 0.90$, the unit structure of Formula (2) has a ratio of mole number (b) within a range of $0.05 \leq b \leq 0.60$, and the unit structure of Formula (3) has a ratio of mole number (c) within a range of $0.001 \leq c \leq 0.40$, when a total mole number of all unit structures constituting the polymer is 1.0, and the polymer having a weight average molecular weight of 3,000 to 100,000; a crosslinkable compound; a photoacid generator; and a solvent.

2 Claims, No Drawings

(56) References Cited

U.S. PATENT DOCUMENTS

| | | |
|---|---|---|
| 2007/0207406 A1 | 9/2007 | Guerrero et al. |
| 2008/0090184 A1* | 4/2008 | Sui et al. .................... 430/327 |
| 2008/0227037 A1* | 9/2008 | Hatakeyama et al. ........ 430/323 |
| 2009/0087799 A1* | 4/2009 | Tachibana et al. ........... 430/323 |

FOREIGN PATENT DOCUMENTS

| | | |
|---|---|---|
| JP | A-2005-70154 | 3/2005 |
| JP | A-2008-15422 | 1/2008 |
| WO | WO 2005/093513 A2 | 10/2005 |
| WO | WO 2005/111719 A2 | 11/2005 |
| WO | WO 2005/111724 A1 | 11/2005 |
| WO | WO 2007/054813 A2 | 5/2007 |
| WO | WO 2009/038126 A1 | 3/2009 |

OTHER PUBLICATIONS

Dec. 28, 2010 International Search Report issued in International Application No. PCT/JP2010/071816 (with translation).

* cited by examiner

COMPOSITION FOR FORMING PHOTOSENSITIVE RESIST UNDERLAYER FILM

TECHNICAL FIELD

The present invention relates to a composition for forming a resist underlayer film to be used in a lithography process for producing semiconductor devices and a method for forming a resist pattern using the composition for forming a resist underlayer film.

BACKGROUND ART

Microfabrication has been carried out by lithography using a photoresist in the production of semiconductor devices. Here, the microfabrication is a processing method in which a photoresist thin film is formed on a semiconductor substrate such as a silicon wafer, active light such as ultraviolet light is applied onto the film through a mask pattern with a pattern of a device followed by development, the substrate is etched using the obtained photoresist pattern as a protective film, and a fine concave-convex structure corresponding to the pattern is consequently formed on a substrate surface.

In recent years, devices have been highly integrated, and the exposing light to be used has had a shorter wavelength, for example, a KrF excimer laser (a wavelength of 248 nm) and an ArF excimer laser (a wavelength of 193 nm). Such a change raises a problem of reducing dimensional precision of a photoresist pattern in a photolithography process by the effect of standing waves caused by reflections of exposed light from a substrate and by the effect of irregular reflections of exposed light due to level difference of a substrate.

To address the problem, a method of providing an anti-reflective coating (Bottom Anti-Reflective Coating, BARC) between a photoresist and a substrate has been widely studied.

Conventionally proposed anti-reflective coatings are typically formed using a thermally crosslinkable composition for preventing intermixing with a photoresist that is applied on the anti-reflective coating, and the formed anti-reflective coating is insoluble in an alkaline developer that is used for development of the photoresist. Thus, the removal of the anti-reflective coating prior to semiconductor substrate processing is carried out by dry etching (for example, see Patent Document 1), but the photoresist is also dry etched at that time. This makes it difficult to ensure a film thickness of the photoresist necessary for substrate processing and raises serious problems especially when a thin-film photoresist is used in order to improve resolution.

Meanwhile, as an ion implantation process in the production of semiconductor devices, a process of introducing impurity ions that impart n-type or p-type conductivity into a semiconductor substrate using a photoresist pattern as a mask may be adopted. In the process, it is undesirable to perform dry etching during the pattern formation of a photoresist in order to prevent the damage to a substrate surface. In other words, in the formation of a photoresist pattern for the ion implantation process, it is undesirable to use an anti-reflective coating that is required to be removed by dry etching as an underlayer of a photoresist.

However, a photoresist pattern that has been used as a mask in the ion implantation process has a comparatively large pattern line width and has been less affected by the standing wave caused by reflections of exposed light from a substrate or the irregular reflections of exposed light due to level difference of a substrate. Thus, by using a photoresist containing a dye or using an anti-reflective coating on a photoresist, the problems due to reflections have been solved.

However, as devices have a finer structure in recent years, a photoresist used in the ion implantation process has been required to have a fine pattern, and this has required an anti-reflective coating (resist underlayer film) on an under layer of a photoresist.

In view of such circumstances, there is a demand for the development of an anti-reflective coating that can be dissolved in an alkaline developer used for the development of a photoresist, does not require a dry etching process, and can be developed and removed concurrently with a photoresist, and there are some studies on such an anti-reflective coating (resist underlayer film) (for example, see Patent Document 2, Patent Document 3, Patent Document 4, Patent Document 5, and Patent Document 6).

RELATED ART DOCUMENTS

Patent Documents

Patent Document 1: U.S. Pat. No. 6,156,479 specification
Patent Document 2: Japanese Patent Application Publication No. JP-A-2004-54286
Patent Document 3: Japanese Patent Application Publication No. JP-A-2005-70154
Patent Document 4: International Publication No. WO 2005/093513 pamphlet
Patent Document 5: International Publication No. WO 2005/111719 pamphlet
Patent Document 6: International Publication No. WO 2005/111724 pamphlet

SUMMARY OF THE INVENTION

Problem to be Solved by the Invention

As described above, some anti-reflective coatings (resist underlayer films) that can be developed and removed concurrently with a photoresist have been proposed until now. However, when such an anti-reflective coating includes a photoacid generator and a photoresist is applied as an upper layer of the coating, the anti-reflective coating is exposed to a solvent in the photoresist, then the solvent penetrates into the anti-reflective coating, and the photoacid generator may be eluted.

In this manner, conventionally proposed anti-reflective coatings that can be developed and removed concurrently with a photoresist do not have sufficiently satisfactory performance in regard to applicability to microfabrication, a formed pattern shape, and the like.

It is an object of the present invention to provide a composition for forming a resist underlayer film in order to form a resist underlayer film that strongly absorbs light having a short wavelength, such as an ArF excimer laser (a wavelength of 193 nm) and a KrF excimer laser (a wavelength of 248 nm) and that is useful as an anti-reflective coating.

In particular, it is an object of the present invention to provide a composition for forming a resist underlayer film in order to form a resist underlayer film having characteristics of effectively absorbing reflected light of irradiation light of an ArF excimer laser or a KrF excimer laser used in microfabrication in a lithography process from a semiconductor substrate, of not causing intermixing with a photoresist film, of not eluting a photoacid generator contained in the resist underlayer film into a solvent in an overcoating photoresist, and of being alkali-developed concurrently with the alkali-development of a photoresist film.

It is another object of the present invention to provide a method for forming a photoresist pattern using the composition for forming a resist underlayer film.

Means for Solving the Problem

In order to solve the problems, the inventors of the present invention have carried out intensive studies, as a result, have found that when a polymer component that is used in a composition for forming a resist underlayer film includes a unit structure having an amide linkage, in particular, includes a unit structure having a secondary amide linkage or a tertiary amide linkage, a resist underlayer film obtained from the composition can suppress the elution of a photoacid generator into a photoresist solvent, and the present invention has been accomplished.

That is, the present invention relates to, as a first aspect, a composition for forming a resist underlayer film to be used in a lithography process, the composition including a polymer (A) containing unit structures of Formula (1), Formula (2), and Formula (3):

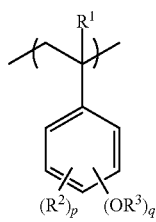

Formula (1)

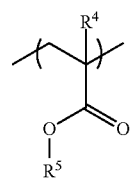

Formula (2)

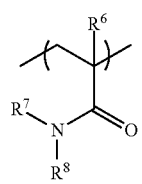

Formula (3)

(in Formula (1), Formula (2), and Formula (3), each of $R^1$, $R^4$, and $R^6$ is a hydrogen atom or a methyl group; in Formula (1), $R^2$ is a monovalent organic group, $R^3$ is a hydrogen atom or a $C_{1-12}$ alkyl group or acyl group, p is an integer of 0 to 3, q is an integer of 1 to 3, and (p+q) is an integer of 1 to 5; in Formula (2), $R^5$ is an acid-cleavable group; and in Formula (3), each of $R^7$ and $R^8$ is independently a hydrogen atom, a substituted or unsubstituted $C_{1-12}$ alkyl group, or a substituted or unsubstituted $C_{6-20}$ aryl group, or $R^7$ and $R^8$ are bonded to each other to form, together with a nitrogen atom bonded thereto, a group having a three- to fifteen-membered ring structure, and $R^7$ and $R^8$ are not a hydrogen atom at the same time), the polymer (A) being a polymer in which the unit structure of Formula (1) has a ratio of mole number (a) within a range of 0.20≤a≤0.90, the unit structure of Formula (2) has a ratio of mole number (b) within a range of 0.05≤b≤0.60, and the unit structure of Formula (3) has a ratio of mole number (c) within a range of 0.001≤c≤0.40, when a total mole number of all unit structures constituting the polymer is 1.0, and the polymer (A) having a weight average molecular weight of 3,000 to 100,000; a crosslinkable compound (D); a photoacid generator (E); and a solvent (F).

As a second aspect, the present invention relates to a composition for forming a resist underlayer film to be used in a lithography process, the composition including a polymer (B) containing unit structures of Formula (1) and Formula (2):

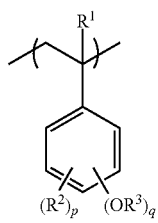

Formula (1)

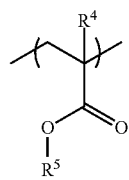

Formula (2)

(in Formula (1) and Formula (2), each of $R^1$ and $R^4$ is a hydrogen atom or a methyl group; in Formula (1), $R^2$ is a monovalent organic group, $R^3$ is a hydrogen atom or a $C_{1-12}$ alkyl group or acyl group, p is an integer of 0 to 3, q is an integer of 1 to 3, and (p+q) is an integer of 1 to 5; and in Formula (2), $R^5$ is an acid-cleavable group), the polymer (B) being a polymer in which the unit structure of Formula (1) has a ratio of mole number (a) within a range of 0.20≤a≤0.90, and the unit structure of Formula (2) has a ratio of mole number (b) within a range of 0.05≤b≤0.6, when a total mole number of all unit structures constituting the polymer is 1.0, and the polymer (B) having a weight average molecular weight of 3,000 to 100,000; a polymer (C) containing unit structures of Formula (1) and Formula (3):

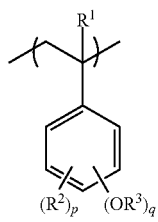

Formula (1)

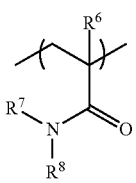

Formula (3)

(in Formula (1) and Formula (3), each of $R^1$ and $R^6$ is a hydrogen atom or a methyl group; in Formula (1), $R^2$ is a monovalent organic group, $R^3$ is a hydrogen atom or a $C_{1-12}$ alkyl group or acyl group, q is an integer of 1 to 3, p is an integer of 0 to 3, and (p+q) is an integer of 1 to 5; and in Formula (3), each of $R^7$ and $R^8$ is independently a hydrogen atom, a substituted or unsubstituted $C_{1-12}$ alkyl group, or a substituted or unsubstituted $C_{6-20}$ aryl group, or $R^7$ and $R^8$ are bonded to each other to form, together with a nitrogen atom bonded thereto, a group having a three- to fifteen-membered ring structure, and $R^7$ and $R^8$ are not a hydrogen atom at the same time), the polymer (C) being a polymer in which the unit structure of Formula (1) has a ratio of mole number (a) within a range of $0.20 \leq a \leq 0.90$, and the unit structure of Formula (3) has a ratio of mole number (c) within a range of $0.001 \leq c \leq 0.40$, when a total mole number of all unit structures constituting the polymer is 1.0, and the polymer (C) having a weight average molecular weight of 3,000 to 100,000; a crosslinkable compound (D); a photoacid generator (E); and a solvent (F), in which a ratio of the polymer (B) and the polymer (C) is 1:0.01 to 1:1 by weight.

As a third aspect, the present invention relates to the composition for forming a resist underlayer film according to the first aspect or the second aspect, in which, in Formula (1), $R^3$ is a hydrogen atom or an acetyl group.

As a fourth aspect, the present invention relates to the composition for forming a resist underlayer film according to any one of the first aspect to the third aspect, in which, in Formula (2), $R^5$ is an acid-cleavable group having a tertiary carbon atom or a secondary carbon atom.

As a fifth aspect, the present invention relates to the composition for forming a resist underlayer film according to any one of the first aspect to the fourth aspect, in which, in Formula (3), an amide group: $—C(O)(NR^7R^8)$ group is a group having an amide linkage derived from a secondary amide or a tertiary amide.

As a sixth aspect, the present invention relates to the composition for forming a resist underlayer film according to any one of the first aspect to the fifth aspect, in which the crosslinkable compound (D) is a compound of Formula (4):

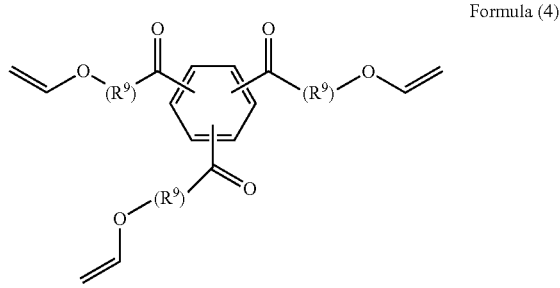

Formula (4)

(in Formula (4), $R^9$ is a *—$(CH_2)nO$— group or a *—$(CH_2O)n$- group (where the linkage with * is bonded to an ether moiety), and n is an integer of 1 to 10).

As a seventh aspect, the present invention relates to the composition for forming a resist underlayer film according to the first aspect, in which the composition includes 1% by mass to 100% by mass of the crosslinkable compound (D) and 0.1% by mass to 20% by mass of the photoacid generator (E) based on a total mass of the polymer (A).

As an eighth aspect, the present invention relates to the composition for forming a resist underlayer film according to the second aspect, in which the composition includes 1% by mass to 100% by mass of the crosslinkable compound (D) and 0.1% by mass to 20% by mass of the photoacid generator (E) based on a total mass of the polymer (B) and the polymer (C).

As a ninth aspect, the present invention relates to the composition for forming a resist underlayer film according to any one of the first aspect to the eighth aspect, the composition further including a basic compound (G).

As a tenth aspect, the present invention relates to the composition for forming a resist underlayer film according to the ninth aspect, in which the composition includes 0.001 to 5 parts by mass of the basic compound (G) with respect to 100 parts by mass of the polymer (A).

As an eleventh aspect, the present invention relates to the composition for forming a resist underlayer film according to the ninth aspect, in which the composition includes 0.001 to 5 parts by mass of the basic compound (G) with respect to 100 parts by mass in a total mass of the polymer (B) and the polymer (C).

As a twelfth aspect, the present invention relates to a method for forming a photoresist pattern to be used in a production of a semiconductor device, the method including applying the composition for forming a resist underlayer film as described in any one of the first aspect to the eleventh aspect on a semiconductor substrate followed by baking to form a resist underlayer film, forming a photoresist film on the resist underlayer film, exposing the semiconductor substrate coated with the resist underlayer film and the photoresist film, and developing the photoresist film and the resist underlayer film after the exposure.

Effects of the Invention

The composition for forming a resist underlayer film to be used in a lithography process of the present invention is characterized by adopting a polymer containing a unit structure having an amide linkage as a polymer component. This enables the suppression of elution of a photoacid generator contained in a resist underlayer film from the resist underlayer film by a solvent even when the composition for forming a resist underlayer film is applied on a substrate and baked to form the underlayer film, then a photoresist layer is formed on the underlayer film, and the solvent in the photoresist penetrates into the resist underlayer film.

According to the composition for forming a resist underlayer film for lithography of the present invention, an underlayer film that is formed by using the composition and on which a photoresist layer is formed is alkali-developed concurrently with the alkali-development of the photoresist film, that is, the underlayer film can be developed and removed concurrently with the photoresist without dry etching.

The composition for forming a resist underlayer film for lithography can form a resist underlayer film (anti-reflective coating) that strongly absorbs light having a short wavelength, specifically a KrF excimer laser (a wavelength of 248 nm) and an ArF excimer laser (a wavelength of 193 nm). Hence, the obtained resist underlayer film can efficiently absorb reflected light from a substrate, and therefore the present invention can provide a resist underlayer film effectively absorbing reflected light from a semiconductor substrate in microfabrication using, for example, the KrF excimer laser and the ArF excimer laser, that is, a resist underlayer film having a practical refractive index and attenuation coefficient in the wavelengths.

A resist underlayer film obtained from the composition for forming a resist underlayer film of the present invention is insoluble in a solvent (for example, propylene glycol monomethyl ether and propylene glycol monomethyl ether acetate) in a composition for forming a photoresist, and consequently can prevent the intermixing with a photoresist layer.

A resist underlayer film obtained from the composition for forming a resist underlayer film of the present invention has an excellent lithography property, and the exposure to a resist underlayer film concurrently with a photoresist layer that is formed on the underlayer film can achieve the formation of a rectangular resist pattern along with the overcoated photoresist film.

Therefore, the present invention can provide a resist underlayer film that can form a photoresist pattern having a good shape with little footing at a lower part.

MODES FOR CARRYING OUT THE INVENTION

As described above, the composition for forming a resist underlayer film to be used in a lithography process of the present invention is characterized by adopting, as a polymer component, a polymer containing a unit structure having an amide linkage, especially an amide linkage derived from a secondary amide [R—C(=O)NHR'] or a tertiary amide [R—C(=O)NR'R''][R', R''≠H]. It is supposed that the formation of interaction between such an amide linkage and a polar group contained in a photoacid generator enables the suppression of elution of the photoacid generator.

The unit structure of Formula (1) includes a hydroxy group or a precursor of the hydroxy group as represented by a —OR$^3$ group (R$^3$ is a hydrogen atom, an alkyl group, or an acyl group). Such a hydroxy group forms an acetal linkage with a crosslinkable compound (D) such as a vinyl ether compound through thermal cross-linking. The linkage between the carbon atom and the oxygen atom is cleaved by an acid generated from a photoacid generator (E) at the time of exposure to be degraded into a hydroxy group, and the composition obtains alkali solubility (solubility in a developer). Therefore, the composition can be developed and removed concurrently with a photoresist without dry etching.

In the present invention, between the unit structure of Formula (1) and the crosslinkable compound (vinyl ether compound) (D), a great number of acetal linkages are formed in a resist underlayer film. Hence, after the exposure and development using a fine pattern, the resist underlayer film includes a great number of cleaved linkages. On this account, many phenolic hydroxy groups are re-generated after the development, and the exposed area obtains alkali solubility. This enables the formation of a fine pattern to lead to the improvement of resolution.

Hereinafter, each component constituting the composition for forming a resist underlayer film of the present invention will be described in detail.

The present invention is a composition for forming a resist underlayer film to be used in a lithography process, and the composition includes a polymer (A) containing the unit structures of above Formula (1), Formula (2), and Formula (3) and having a weight average molecular weight of 3,000 to 100,000, a crosslinkable compound (D), a photoacid generator (E), and a solvent (F).

The polymer (A) is a copolymer containing the unit structures of Formula (1), Formula (2), and Formula (3).

The present invention is also a composition for forming a resist underlayer film to be used in a lithography process, and the composition includes a polymer (B) containing the unit structures of above Formula (1) and Formula (2) and having a weight average molecular weight of 3,000 to 100,000, a polymer (C) containing the unit structures of above Formula (1) and Formula (3) and having a weight average molecular weight of 3,000 to 100,000, a crosslinkable compound (D), a photoacid generator (E), and a solvent (F).

The polymer (B) is a copolymer containing the unit structures of Formula (1) and Formula (2), and the polymer (C) is a copolymer containing the unit structures of Formula (1) and Formula (3). The polymer (B) and the polymer (C) are used as a polymer mixture.

[Polymer (A) to Polymer (C)]

In above Formula (1) to Formula (3) in the polymer (A) to the polymer (C) used in the present invention, R$^1$ to R$^8$, p, and q are as follows.

In above Formula (1), Formula (2), and Formula (3), each of R$^1$, R$^4$, and R$^6$ is a hydrogen atom or a methyl group.

In Formula (1), R$^2$ is a monovalent organic group. Examples of the organic group include a C$_{1-12}$ alkyl group and a C$_{6-20}$ aryl group.

Examples of the C$_{1-12}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the C$_{6-20}$ aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

These alkyl groups and aryl groups may be substituted with, for example, a halogen atom (fluorine, chlorine, bromine, and iodine), a nitro group, and a cyano group.

In Formula (1), $R^3$ is a hydrogen atom or a $C_{1-12}$ alkyl group or acyl group. Accordingly, when $R^3$ is a hydrogen atom, an $OR^3$ group is a hydroxy group, when $R^3$ is an alkyl group, an $OR^3$ group is an alkoxy group, and when $R^3$ is an acyl group, an $OR^3$ group is an acyloxy group.

Examples of the $C_{1-12}$ alkyl group include the groups exemplified in the definition for $R^2$.

Examples of the $C_{1-12}$ acyl group include an acyl group represented by a RC(O)— group of which the R moiety is any of the $C_{1-12}$ alkyl groups and the $C_{6-20}$ aryl groups exemplified in the definition for $R^2$.

Among them, $R^3$ is preferably a hydrogen atom or an acetyl group.

In Formula (1), p is an integer of 0 to 3, and q is an integer of 1 to 3. In addition, (p+q) is an integer of 1 to 5.

In Formula (2), $R^5$ is an acid-dissociable group.

The acid-cleavable group of $R^5$ is preferably an organic group having a tertiary carbon atom.

In Formula (2), an organic group containing $R^5$: —$COOR^5$ is considered as carboxylic acid ester that is one of acid-labile groups.

Specific examples of such an organic group containing $R^5$ include an alkyl ester group that includes a tertiary carbon atom at the α position of the ester linkage, typified by a tert-butyl ester group.

Additional usable examples of the organic group containing $R^5$ include an ester group having an alicyclic hydrocarbon group or a lactone ring containing tertiary carbon at the α position. In such a case, $R^5$ corresponds to the alicyclic hydrocarbon group or the lactone ring containing tertiary carbon at the α position. Examples of such an ester group containing $R^5$ include an alicyclic ester group containing a tertiary carbon atom at an α position of the ether linkage, such as a 1-alkylcycloalkyl ester group, a 2-alkyl-2-adamantyl ester group, and 1-(1-adamantyl)-1-alkylalkyl ester group.

Here, examples of the alkyl group include the alkyl groups exemplified in the above definition for $R^2$.

Additional examples of the organic group containing $R^5$ include an organic group having a tertiary carbon atom or a secondary carbon atom.

Examples of such a carbon atom include a carbon atom in an acetal linkage, such as a tertiary carbon atom and a secondary carbon atom in an acetal linkage.

Examples of the ester group containing $R^5$ include an acetal type ester group such as a methoxymethyl ester group, an ethoxymethyl ester group, a 1-ethoxyethyl ester group, a 1-isobutoxyethyl ester group, a 1-isopropoxyethyl ester group, a 1-ethoxypropyl ester group, a 1-(2-methoxyethoxy) ethyl ester group, a 1-(2-acetoxyethoxy)ethyl ester group, a 1-[2-(1-adamantyloxy)ethoxy]ethyl ester group, a 1-[2-(1-adamantanecarbonyloxy)ethoxy]ethyl ester group, a tetrahydro-2-furyl ester group, and a tetrahydro-2-pyranyl ester group; and an isobornyl ester group.

In Formula (3), each of $R^7$ and $R^8$ is independently a hydrogen atom, a substituted or unsubstituted $C_{1-12}$ alkyl group, or a substituted or unsubstituted $C_{6-20}$ aryl group, or $R^7$ and $R^8$ are bonded to each other together with the nitrogen atom bonded thereto to form a group having a three- to fifteen-membered ring structure. However, $R^7$ and $R^8$ are not a hydrogen atom at the same time.

In other words, in Formula (3), a —CO—$NR^7R^8$ group containing $R^7$ and $R^8$ is a group having an amide linkage derived from a secondary amide [R—C(=O)NHR'] or a tertiary amide [R—C(=O)NR'R''][R', R''≠H].

Examples of the $C_{1-12}$ alkyl group and the $C_{6-20}$ aryl group include the groups exemplified in the above definition for $R^2$.

Examples of the group having a ring structure that is formed by bonding $R^7$ and $R^8$ to each other together with the nitrogen atom bonded thereto include a pyridine ring and a morpholine ring.

<Polymer (A)>

The polymer (A), which is a copolymer, containing the unit structures of Formula (1), Formula (2), and Formula (3) is a polymer in which, when the total mole number of all the unit structures constituting the polymer is 1.0, the unit structure of Formula (1) has a ratio of mole number (a) within a range of 0.20≤a≤0.90, the unit structure of Formula (2) has a ratio of mole number (b) within a range of 0.05≤b≤0.60, and the unit structure of Formula (3) has a ratio of mole number (c) within a range of 0.001≤c≤0.40.

<Polymer (B) and Polymer (C)>

The polymer (B) containing the unit structures of Formula (1) and Formula (2) is a polymer in which, when the total mole number of all the unit structures constituting the polymer is 1.0, the unit structure of Formula (1) has a ratio of mole number (a) within a range of 0.20≤a≤0.90 and the unit structure of Formula (2) has a ratio of mole number (b) within a range of 0.05≤b≤0.6.

The polymer (C) containing the unit structures of Formula (1) and Formula (3) is a polymer in which, when the total mole number of all the unit structures constituting the polymer is 1.0, the unit structure of Formula (1) has a ratio of mole number (a) within a range of 0.20≤a≤0.90 and the unit structure of Formula (3) has a ratio of mole number (c) within a range of 0.001≤c≤0.40.

When the unit structure of Formula (1) has a mole number (a) of less than 0.20 based on a total mole number of all the unit structures constituting the polymer of 1.0, the obtained composition is likely to have a reduced curing property, while when the unit structure of above Formula (1) has a mole number (a) of more than 0.90, the obtained composition is likely to have an increased absorbance and to have poor solubility in an alkali developer.

When the unit structure of above Formula (2) has a mole number (b) of less than 0.05 based on a total mole number of all the unit structures constituting the polymer of 1.0, the composition is likely to have an insufficient alkali developing speed, while when the unit structure of Formula (2) has a mole number (b) of more than 0.60, a resist film after development is likely to have lowered contrast.

When the unit structure of above Formula (3) has a mole number (c) of less than 0.001 based on a total mole number of all the unit structures constituting the polymer of 1.0, a photoacid generator is likely to be eluted from a resist underlayer film, while when the unit structure of Formula (3) has a mole number (c) of more than 0.40, the composition is likely to have poor solubility in an alkali developer.

[Crosslinkable Compound (D)]

The crosslinkable compound (D) is a compound preferably having at least two vinyl ether groups and is preferably a compound having two to 20 vinyl ether groups, for example, three to ten vinyl ether groups, or three to six vinyl ether groups.

Examples of such a compound include bis(4-(vinyloxymethyl)cyclohexylmethyl) glutarate, tri(ethylene glycol) divinyl ether, divinyl ester adipate, diethylene glycol divinyl ether, tris(4-vinyloxy)butyl trimellitate, bis(4-(vinyloxy)butyl) terephthalate, bis(4-(vinyloxy)butyl) isophthalate, cyclohexanedimethanol divinyl ether, 1,4-butanediol divinyl ether, diethylene glycol divinyl ether, dipropylene glycol divinyl ether, trimethylolpropane trivinyl ether, and pentaerythritol tetravinyl ether. These compounds may be used singly or in combination of two or more of them.

Additional examples of the crosslinkable compound (D) include the compound of above Formula (4). In Formula (4), $R^9$ is a *—O(CH$_2$)n-group or a *—(OCH$_2$) n-group (where the linkage with * is bonded to the ether moiety), and n is an integer of 1 to 10.

Examples of the crosslinkable compound (D) of above Formula (4) include compounds of Formula (4-1) to Formula (4-6).

Formula (4-1)
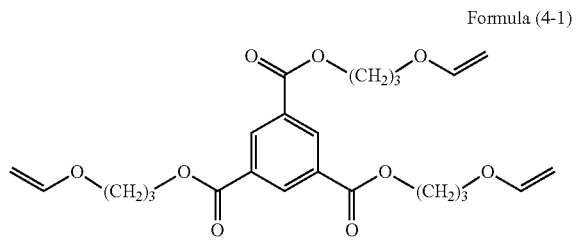

Formula (4-2)
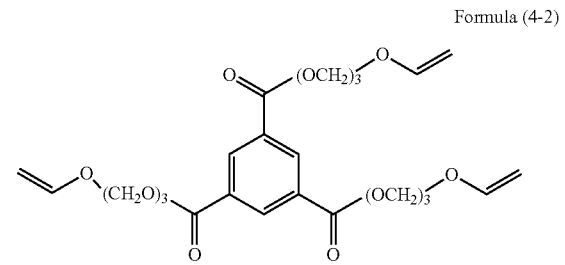

Formula (4-3)
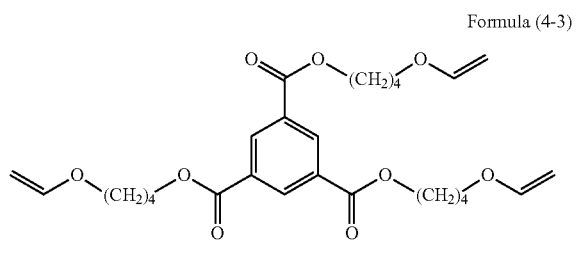

Formula (4-4)
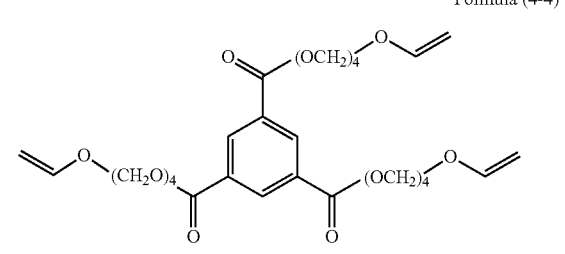

Formula (4-5)
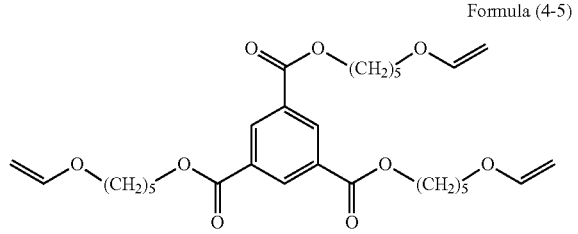

Formula (4-6)
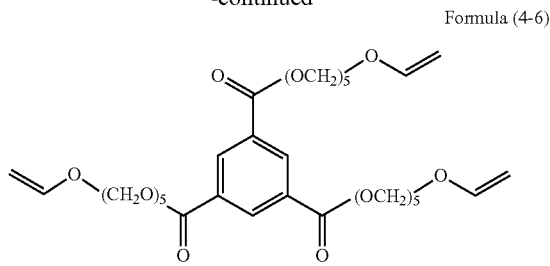

The crosslinkable compound (D) may be used in an amount ranging from 1% by mass to 100% by mass or from 10% by mass to 70% by mass based on the total mass of the polymer (A) or based on the total mass of the polymer (B) and the polymer (C).

[Photoacid Generator (E)]

The composition for forming a resist underlayer film of the present invention includes a photoacid generator (E). Examples of the photoacid generator (E) include a compound that generates an acid by the irradiation of light used for exposure. Examples of the photoacid generator include a diazomethane compound, an onium salt compound, a sulfone imide compound, a nitrobenzyl compound, a benzoin tosylate compound, a halogen-containing triazine compound, and a cyano group-containing oxime sulfonate compound. Among them, the photoacid generator of an onium salt compound is preferred.

Specific examples of the onium salt compound include a triphenylsulfonium salt compound such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethane sulfonate, triphenylsulfonium 2-(3-tetracyclo[4.4.0.1$^{2,5}$.1$^{7,10}$]dodecanyl)-1,1-difluoroethane sulfonate, triphenylsulfonium N,N'-bis(nonafluoro-n-butanesulfonyl)imidate, and triphenylsulfonium camphorsulfonate; and a diphenyliodonium salt compound such as diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethane sulfonate, diphenyliodonium 2-(3-tetracyclo[4.4.0.1$^{2,5}$.1$^{7,10}$]dodecanyl)-1,1-difluoroethane sulfonate, diphenyliodonium N,N-bis(nonafluoro-n-butanesulfonyl)imidate, and diphenyliodonium camphorsulfonate.

The photoacid generator (E) may be used in an amount ranging from 0.1% by mass to 20% by mass or from 1% by mass to 15% by mass based on the total mass of the polymer (A) or based on the total mass of the polymer (B) and the polymer (C).

[Basic Compound (G)]

The composition for forming a resist underlayer film of the present invention may further include a basic compound (G). As the basic compound (G), an amine can be exemplified. The addition of the basic compound (G) enables the control of sensitivity of a resist underlayer film at the time of exposure. In other words, the basic compound such as an amine can be reacted with an acid generated from a photoacid generator at the time of exposure to lower the sensitivity of a resist underlayer film. In addition, the basic compound can suppress the diffusion of an acid that is generated from a photoacid generator (E) in an exposed area in a resist underlayer film to an unexposed area in the resist underlayer film.

Examples of the amine include, but are not necessarily limited to, a tertiary amine such as triethanolamine, tributanolamine, trimethylamine, triethylamine, tri-n-propylamine, triisopropylamine, tri-n-butylamine, tri-tert-butylamine, tri-n-octylamine, triisopropanolamine, phenyldiethanolamine, stearyl diethanolamine, and diazabicyclooctane; and an aromatic amine such as pyridine and 4-dimethylaminopyridine. Additional examples include a primary amine such as benzylamine and n-butylamine; and a secondary amine such as diethylamine and di-n-butylamine.

The amine works to suppress the diffusion of an acid generated form a photoacid generator (E) into an unexposed area in a resist underlayer film as well as is integrated into a cross-linked polymer that is formed through thermal cross-linking of a polymer (A) or a polymer mixture of a polymer (B) and a polymer (C) with a crosslinkable compound (D), then the cross-linkage is cleaved by an acid generated from the photoacid generator (E) in an exposed area to form a hydroxy group, and the amine is soluble in an alkali developer. Hence, an amine having a hydroxy group is preferred. Suitably used examples of the amine having a hydroxy group include, for example, triethanolamine and tributanolamine.

These amines may be used singly or in combination of two or more of them. When an amine is used, the amine is contained in an amount of 0.001 to 5 parts by mass, for example 0.01 to 1 part by mass, or 0.1 to 0.5 part by mass, based on 100 parts by mass of the polymer (A) or of the total of the polymer (B) and the polymer (C). A composition containing an amine in an amount more than the value above may have an excessively reduced sensitivity.

[Other Optional Components Capable of being Included]

The composition for forming a resist underlayer film of the present invention may include, as optional components, a surfactant, a rheology control agent, an adhesion assistant, an organic polymer, an absorbent compound, and the like.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; and fluorochemical surfactants including EFTOP EF301, EF303, and EF352 (manufactured by Jemco (formerly Tochem Products)), MEGAFAC F171, F173, and R30 (manufactured by DIC Corporation (formerly Dainippon Ink and Chemicals, Inc.)), Fluorad FC430 and FC431 (manufactured by Sumitomo 3M), Asahiguard AG710, Surflon S-382, SC101, SC102, SC103, SC104, SC105, and SC106 (manufactured by Asahi Glass Co., Ltd.); and organosiloxane polymer KP 341 (manufactured by Shin-Etsu Chemical Co., Ltd.). Such a surfactant is commonly contained in an amount of 0.2% by mass or less and preferably 0.1% by mass or less based on the total components in the composition for forming a resist underlayer film of the present invention. These surfactants may be added singly or in combination of two or more of them.

[Solvent (F)]

The composition for forming a resist underlayer film of the present invention further includes a solvent (F).

Examples of the solvent used in the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methyl-2-pyrrolidone. In addition, these solvents may be used singly or in combination of two or more of them. High-boiling solvents such as propylene glycol monobutyl ether and propylene glycol monobutyl ether acetate may be mixed to be used.

The composition for forming a resist underlayer film of the present invention has a solid content of for example, 0.5 to 50% by mass, 1 to 30% by mass, or 1 to 25% by mass. Here, the solid content is a content of all components except for the solvent component in the composition for forming a film (resist underlayer film).

In the solid content, the ratio of the polymer (A) or the total ratio of the polymer (B) and the polymer (C) is 20% by mass or more, for example, 50 to 100% by mass, 60 to 100% by mass, or 70 to 100% by mass.

In addition, the ratio of the polymer (B) and the polymer (C) may be 1:0.01 to 1:1 by mass.

The composition for forming a resist underlayer film of the present invention can be prepared by dissolving each component in an appropriate solvent and is used in a homogeneous solution state.

The prepared composition (solution) for forming a resist underlayer film is preferably filtered using, for example, a filter having a pore size of, for example, about 0.2 μm to be used. The composition for forming a resist underlayer film prepared in this manner has excellent storage stability at room temperature for a long time.

Hereinafter, a method for forming a photoresist pattern to be used in a production of a semiconductor device using the composition for forming a resist underlayer film of the present invention will be described.

On a substrate [for example, a semiconductor substrate such as a silicon coated with a silicon oxide film, a semiconductor substrate such as a silicon coated with a silicon nitride film or a silicon nitride-oxide film, a silicon nitride substrate, a quartz substrate, a glass substrate (including a non-alkali glass, a low-alkali glass, and a crystallized glass), and a glass substrate on which an ITO film is formed], the composition for forming a resist underlayer film of the present invention is applied by an appropriate coating means such as a spinner and a coater, and then baked using a heating means such as a hot plate to form a resist underlayer film.

The baking conditions are appropriately selected from a baking temperature of 80° C. to 250° C. and a baking time of 0.3 minute to 60 minutes. Preferably, the baking temperature is 130° C. to 250° C. and the baking time is 0.5 minute to 5 minutes. Here, the resist underlayer film has a film thickness of 0.01 µm to 3.0 µm, for example, 0.03 µm to 1.0 µm, or 0.05 µm to 0.5 µm.

A vinyl ether compound as the crosslinkable compound (D) is cross-linked by the baking at the time of formation to make the resist underlayer film formed from the composition for forming a resist underlayer film of the present invention a robust film. As a result, the film obtains a low solubility in an organic solvent that is commonly used as a photoresist solution to be applied on the film, such as ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, γ-butyrolactone, ethyl 2-hydroxypropionate, ethyl 2-hydroxy-2-methylpropionate, ethyl ethoxyacetate, methyl pyruvate, ethyl lactate, and butyl lactate. This makes a resist underlayer film formed from the composition for forming a resist underlayer film of the present invention an underlayer film not causing intermixing with a photoresist.

Here, baking at a lower temperature than the above range may lead to insufficient cross-linking and may cause intermixing with a photoresist. Baking at an excessively high temperature may lead to the cleavage of cross-linkages and may also cause intermixing with a photoresist.

Next, on the resist underlayer film, a photoresist film is formed. The photoresist film can be formed by a common manner, that is, by applying a photoresist solution onto the resist underlayer film followed by baking.

The photoresist formed on the resist underlayer film of the present invention is not particularly limited as long as a photoresist is exposed to exposure light to behave as a positive photoresist. Examples of the photoresist include a positive photoresist composed of a novolac resin and 1,2-naphthoquinone diazide sulfonic acid ester, a chemically amplified photoresist composed of a photoacid generator and a binder having a group that is degraded by an acid to increase an alkali dissolution rate, a chemically amplified photoresist composed of a photoacid generator, an alkali soluble binder, and a low molecular compound that is degraded by an acid to increase the alkali dissolution rate of a photoresist, and a chemically amplified photoresist composed of a binder having a group that is degraded by an acid to increase an alkali dissolution rate, a low molecular compound that is degraded by an acid to increase the alkali dissolution rate of a photoresist, and a photoacid generator. Specific examples of the photoresist include PAR855 (trade name) manufactured by Sumitomo Chemical Co., Ltd.

In the method for forming a photoresist pattern to be used in a production of a semiconductor device of the present invention, the exposure is performed through a mask (reticle) for forming a predetermined pattern. The exposure may employ a KrF excimer laser, an ArF excimer laser, or the like. After the exposure, post exposure bake is performed as necessary. The conditions for the post exposure bake are appropriately selected from a heating temperature of 80° C. to 150° C. and a heating time of 0.3 minute to 60 minutes.

After the exposure, both layers of the photoresist film and the resist underlayer film are concurrently developed with an alkaline developer to remove the exposed area in the photoresist film and the resist underlayer film (developing).

Examples of the alkaline developer include alkaline aqueous solutions including an aqueous solution of an alkali metal hydroxide such as potassium hydroxide and sodium hydroxide; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine. Such a developer may further include a surfactant and the like.

The development conditions are appropriately selected from a development temperature of 5° C. to 50° C. and a development time of 10 seconds to 300 seconds. A resist underlayer film formed from the composition for forming a resist underlayer film of the present invention can be developed with a developer that is generally used for the development of a photoresist. For example, the development is easily carried out using an aqueous solution of 2.38% by mass tetramethylammonium hydroxide at room temperature.

The resist underlayer film of the present invention can also be used, for example, as a layer for suppressing interaction between a substrate and a photoresist film, a layer having a function of suppressing adverse effects, on a semiconductor substrate, of a material used for a photoresist film or a substance generated at the time of exposure to a photoresist, a layer having a function of suppressing diffusion of a substance generated from a semiconductor substrate at the time of bake into an upper photoresist film, and a barrier layer for reducing a poisoning effect of a photoresist film due to a dielectric layer of a semiconductor substrate.

Hereinafter, specific examples of the composition for forming a resist underlayer film of the present invention will be described with reference to examples below, but the present invention is not limited to them.

EXAMPLES

Synthesis Example 1

In 100 g of 2-butanone, 20 g of p-acetoxystyrene, 24.5 g of 2-ethyl-2-adamantyl methacrylate, 2.8 g of N-(2-hydroxyethyl)acrylamide, and 2 g of azobisisobutyronitrile were dissolved to prepare a homogeneous monomer solution. Separately, 100 g of 2-butanone was charged in a 300-mL three-necked flask, and the flask was purged with nitrogen for 30 minutes. Next, the monomer solution was added dropwise into the flask over 10 hours using a dropping funnel while refluxing the solution in the flask at a boiling point. After the completion of the dropwise addition, the monomers in the flask were polymerized for 10 hours while refluxing the solution in the flask at the boiling point. After the polymerization, the reaction solution was added dropwise into a large amount of methanol, and the formed copolymer was solidified and purified. Next, to the copolymer, 150 g of propylene glycol monomethyl ether was added once again, and each of 300 g of methanol, 80 g of triethylamine, and 15 g of water was further added. The mixture was refluxed at a boiling point for 8 hours for hydrolysis reaction. After the reaction, the solvents and triethylamine were distilled and removed under reduced pressure, and the obtained copolymer was dissolved in acetone. Then, the solution was added dropwise into a large amount of water for solidification. The formed white powder was filtered and dried under reduced pressure at 50° C. overnight.

The obtained copolymer had an Mw of 8,000 and an Mw/Mn of 1.8. $^{13}$C-NMR analysis of the obtained copolymer revealed a molar ratio of p-hydroxystyrene, 2-ethyl-2-adamantyl methacrylate, and N-(2-hydroxyethyl)acrylamide of 50:40:10. The copolymer is regarded as a resin (A-1).

Synthesis Examples 2 to 12

The following copolymers (resins (A-2) to (A-9)) were obtained in the same manner as in Synthesis Example 1 except that the types and amounts of monomers were changed.

Synthesis Example 2

The copolymer was prepared using, as monomers, p-hydroxystyrene, 2-ethyl-2-cyclohexyl methacrylate, and N-(2-hydroxyethyl)acrylamide in a molar ratio of 50:40:10 (resin (A-2)). The Mw was 9,000 and the Mw/Mn was 1.8.

Synthesis Example 3

The copolymer was prepared using, as monomers, p-hydroxystyrene, t-amyl methacrylate, and N-(2-hydroxyethyl)acrylamide in a molar ratio of 50:40:10 (resin (A-3)). The Mw was 10,000 and the Mw/Mn was 1.7.

Synthesis Example 4

The copolymer was prepared using, as monomers, p-hydroxystyrene, 2-ethyl-2-adamantyl methacrylate, and N,N-diethylacrylamide in a molar ratio of 50:40:10 (resin (A-4)). The Mw was 8,000 and the Mw/Mn was 1.8.

Synthesis Example 5

The copolymer was prepared using, as monomers, p-hydroxystyrene, 2-ethyl-2-cyclohexyl methacrylate, and N,N-diethylacrylamide in a molar ratio of 50:40:10 (resin (A-5)). The Mw was 10,000 and the Mw/Mn was 1.7.

Synthesis Example 6

The copolymer was prepared using, as monomers, p-hydroxystyrene, t-amyl methacrylate, and N,N-diethylacrylamide in a molar ratio of 50:40:10 (resin (A-6)). The Mw was 7,000 and the Mw/Mn was 1.8.

Synthesis Example 7

The copolymer was prepared using, as monomers, p-hydroxystyrene, 2-ethyl-2-adamantyl methacrylate, and acryloylmorpholine in a molar ratio of 50:40:10 (resin (A-7)). The Mw was 8,000 and the Mw/Mn was 1.8.

Synthesis Example 8

The copolymer was prepared using, as monomers, p-hydroxystyrene, 2-ethyl-2-cyclohexyl methacrylate, and acryloylmorpholine in a molar ratio of 50:40:10 (resin (A-8)). The Mw was 8,000 and the Mw/Mn was 1.7.

Synthesis Example 9

The copolymer was prepared using, as monomers, p-hydroxystyrene, t-amyl methacrylate, and acryloylmorpholine in a molar ratio of 50:40:10 (resin (A-9)). The Mw was 7,000 and the Mw/Mn was 1.8.

Synthesis Example 10

The copolymer was prepared using, as monomers, p-hydroxystyrene and 2-ethyl-2-adamantyl methacrylate in a molar ratio of 60:40 (resin (A-10)). The Mw was 7,000 and the Mw/Mn was 1.8.

Synthesis Example 11

The copolymer was prepared using, as monomers, p-hydroxystyrene and N-(2-hydroxyethyl)acrylamide in a molar ratio of 80:20 (resin (A-11)). The Mw was 7,000 and the Mw/Mn was 1.8.

Synthesis Example 12

The copolymer was prepared using, as monomers, styrene, methacrylic acid, and t-butyl methacrylate in a molar ratio of 30:43:27 (resin (A-12)). The Mw was 12,000 and the Mw/Mn was 1.8.

Synthesis Example 13

The copolymer was prepared using, as monomers, p-hydroxystyrene and 2-methyl-2-adamantyl methacrylate in a molar ratio of 60:40 (resin (A-13)). The Mw was 8,000 and the Mw/Mn was 1.8.

Synthesis Example 14

The copolymer was prepared using, as monomers, p-hydroxystyrene, 2-ethyl-2-adamantyl methacrylate, and N-(2-hydroxyethyl)acrylamide in a molar ratio of 40:10:50 (resin (A-14)). The Mw was 8,000 and the Mw/Mn was 1.8.

Synthesis Example 15

The copolymer was prepared using, as monomers, p-hydroxystyrene and N-(2-hydroxyethyl)acrylamide in a molar ratio of 50:50 (resin (A-15)). The Mw was 7,000 and the Mw/Mn was 1.8.

Example 1 to Example 10 and Comparative Example 1 to Comparative Example 6

As shown in Table 1, components were mixed in corresponding amounts (based on parts by mass) to make a homogeneous solution. The solution was filtered using a polyethylene microfilter having a pore size of 0.10 μm and further filtered using a polyethylene microfilter having a pore size of 0.05 μm to prepare each composition (solution) for forming a resist underlayer film of Example 1 to Example 10 and Comparative Example 1 to Comparative Example 6.

The crosslinkable compound (D), the photoacid generator (E), the amine (G), and the solvent (F) in Table 1 are as follows.

Crosslinkable compound (D): 1,3,5-tris(4-vinyloxybutyl) trimellitic acid (represented as D-1)

Photoacid generator (E): triphenylsulfonium perfluorocyclopropane-1,3-disulfonamide (represented as E-1)

Photoacid generator (E): triphenylsulfonium perfluoro-n-butanesulfonate (represented as E-2)

Photoacid generator (E): triphenylsulfonium trifluoromethanesulfonate (represented as E-3)

Amine (G): triethanolamine (represented as D-1)

Solvent (F): propylene glycol monomethyl ether (represented as F-1)

TABLE 1

Formulation of composition for forming resist underlayer film

| | Polymer | Cross-linkable compound | Photo-acid generator | Amine | Solvent |
|---|---|---|---|---|---|
| Example 1 | (A-1) 100 | (D-1) 40 | (E-1) 5 | (G-1) 0.7 | (F-1) 12000 |
| Example 2 | (A-2) 100 | (D-1) 40 | (E-1) 5 | (G-1) 0.7 | (F-1) 12000 |
| Example 3 | (A-3) 100 | (D-1) 40 | (E-1) 5 | (G-1) 0.7 | (F-1) 12000 |
| Example 4 | (A-4) 100 | (D-1) 40 | (E-2) 4 | (G-1) 0.7 | (F-1) 12000 |
| Example 5 | (A-5) 100 | (D-1) 40 | (E-2) 4 | (G-1) 0.7 | (F-1) 12000 |
| Example 6 | (A-6) 100 | (D-1) 40 | (E-2) 4 | (G-1) 0.7 | (F-1) 12000 |
| Example 7 | (A-7) 100 | (D-1) 40 | (E-3) 5 | (G-1) 0.7 | (F-1) 12000 |
| Example 8 | (A-8) 100 | (D-1) 40 | (E-3) 5 | (G-1) 0.7 | (F-1) 12000 |
| Example 9 | (A-9) 100 | (D-1) 40 | (E-3) 5 | (G-1) 0.7 | (F-1) 12000 |
| Example 10 | (A-10) 80 (A-11) 20 | (D-1) 40 | (E-3) 5 | (G-1) 0.7 | (F-1) 12000 |
| Comparative Example 1 | (A-12) 100 | (D-1) 40 | (E-1) 5 | (G-1) 0.7 | (F-1) 12000 |
| Comparative Example 2 | (A-1) 100 | None | (E-1) 5 | (G-1) 0.7 | (F-1) 12000 |
| Comparative Example 3 | (A-13) 100 | (D-1) 40 | (E-3) 5 | (G-1) 0.7 | (F-1) 12000 |
| Comparative Example 4 | (A-14) 100 | (D-1) 40 | (E-3) 5 | (G-1) 0.7 | (F-1) 12000 |
| Comparative Example 5 | (A-10) 20 (A-11) 80 | (D-1) 40 | (E-3) 5 | (G-1) 0.7 | (F-1) 12000 |
| Comparative Example 6 | (A-10) 80 (A-15) 20 | (D-1) 40 | (E-3) 5 | (G-1) 0.7 | (F-1) 12000 |

In Table, the unit of numbers is parts by mass.

(Elution Test into Photoresist Solvent)

Each composition for forming a resist underlayer film prepared in Example 1 to Example 10 and Comparative Example 1 to Comparative Example 6 was applied on a semiconductor substrate (silicon wafer) with a spinner. The coated substrate was baked on a hot plate at 200° C. for 1 minute to form a resist underlayer film (a film thickness of 0.04 μm).

The resist underlayer film was immersed in propylene glycol monomethyl ether (PGME) that is a solvent used for a photoresist.

It was ascertained that Example 1 to Example 10, Comparative Example 1, and Comparative Example 3 to Comparative Example 6 had poor solubility in PGME. The resist underlayer film in Comparative Example 2 was dissolved in PGME and no resist underlayer film remained.

(Lamination Test of Photoresist)

Each composition for forming a resist underlayer film prepared in Example 1 to Example 10 and Comparative Example 1 to Comparative Example 6 was applied on a semiconductor substrate (silicon wafer) with a spinner. The coated substrate was baked on a hot plate at 200° C. for 1 minute to form a resist underlayer film (a film thickness of 0.04 μm).

On the resist underlayer film, a commercially available photoresist solution (manufactured by Sumitomo Chemical Co., Ltd., trade name: PAR855) was applied with a spinner and heated on a hot plate at 100° C. for 60 seconds.

In Example 1 to Example 10, Comparative Example 1, and Comparative Example 3 to Comparative Example 6, a photoresist film (a film thickness of 0.140 μm) was formed because each resist underlayer had poor solubility in the photoresist solution. The total film thickness was 0.180 μm.

By contrast, the resist underlayer film in Comparative Example 2 was mixed with the photoresist solution because it is readily soluble in the photoresist solution. Hence, there was unevenness on the coating or the photoresist film was not laminated on the resist underlayer film. The total film thickness was 0.147 μm.

(Evaluation of Optical Parameter)

Each composition for forming a resist underlayer film prepared in Example 1 to Example 10 and Comparative Example 1 to Comparative Example 6 was applied on a silicon wafer with a spinner. The coated substrate was baked on a hot plate at 200° C. for 1 minute to form a resist underlayer film (a film thickness of 0.04 μm).

Next, the refractive indices (n values) and the attenuation coefficients (k values) of each resist underlayer film were measured at wavelengths of 248 nm and 193 nm using an optical ellipsometer (manufactured by J. A. Woollam, VUV-VASE VU-302). The measurement results are shown in Table 2.

TABLE 2

Optical parameter: refractive index (n value) and attenuation coefficient (k value)

| | 248 nm n value | 248 nm k value | 193 nm n value | 193 nm k value |
|---|---|---|---|---|
| Example 1 | 1.73 | 0.02 | 1.55 | 0.44 |
| Example 2 | 1.73 | 0.02 | 1.55 | 0.44 |
| Example 3 | 1.73 | 0.02 | 1.55 | 0.44 |
| Example 4 | 1.73 | 0.02 | 1.55 | 0.44 |
| Example 5 | 1.73 | 0.02 | 1.55 | 0.44 |
| Example 6 | 1.73 | 0.02 | 1.55 | 0.44 |
| Example 7 | 1.73 | 0.02 | 1.55 | 0.44 |
| Example 8 | 1.73 | 0.02 | 1.55 | 0.44 |
| Example 9 | 1.73 | 0.02 | 1.55 | 0.44 |
| Example 10 | 1.73 | 0.02 | 1.55 | 0.44 |
| Comparative Example 1 | 1.70 | 0.02 | 1.63 | 0.40 |
| Comparative Example 2 | 1.71 | 0.02 | 1.55 | 0.46 |
| Comparative Example 3 | 1.73 | 0.02 | 1.60 | 0.45 |
| Comparative Example 4 | 1.73 | 0.02 | 1.55 | 0.46 |
| Comparative Example 5 | 1.73 | 0.02 | 1.60 | 0.45 |
| Comparative Example 6 | 1.73 | 0.02 | 1.55 | 0.46 |

As shown in Table 2, the obtained results revealed that the resist underlayer film obtained from each composition for forming a resist underlayer film of the present invention (Example 1 to Example 10) was substantially the same as Comparative Example 1 to Comparative Example 6, that is, the resist underlayer film had sufficiently effective refractive indices and attenuation coefficients with respect to light at 248 nm and 193 nm.

(Evaluation of Pattern Shape)

Each composition for forming a resist underlayer film prepared in Example 1 to Example 10 and Comparative Example 1 to Comparative Example 6 was applied on a silicon wafer with a spinner. The coated substrate was baked on a hot plate at 200° C. for 1 minute to form a resist underlayer film (a film thickness of 0.04 μm).

On the resist underlayer film, a commercially available photoresist solution (manufactured by Sumitomo Chemical Co., Ltd., trade name: PAR855) was applied with a spinner and heated on a hot plate at 100° C. for 60 seconds to form a photoresist film (a film thickness of 0.140 μm).

Next, the substrate was exposed using S307E scanner manufactured by NIKON CORPORATION (wavelength 193 nm, NA: 0.85, sigma=0.93) through a mask designed so that the photoresist pattern would have a line width of 0.13 μm and a width between lines of 0.13 μm after development. Then, the substrate was subjected to post exposure bake on a hot plate at 105° C. for 60 seconds. After cooling, the substrate was developed using 0.26N aqueous tetramethylammonium hydroxide solution as a developer.

After the development, each cross section of the obtained photoresist patterns was observed under a scanning electron microscope (SEM). The evaluation results are shown in Table 3.

TABLE 3

|  | Pattern shape | Residue |
|---|---|---|
| Example 1 | Rectangle | None |
| Example 2 | Rectangle | None |
| Example 3 | Rectangle | None |
| Example 4 | Rectangle | None |
| Example 5 | Rectangle | None |
| Example 6 | Rectangle | None |
| Example 7 | Rectangle | None |
| Example 8 | Rectangle | None |
| Example 9 | Rectangle | None |
| Example 10 | Rectangle | None |
| Comparative Example 1 | Severe footing | A large amount |
| Comparative Example 2 | No pattern was formed | — |
| Comparative Example 3 | Severe footing | A large amount |
| Comparative Example 4 | Severe footing | A large amount |
| Comparative Example 5 | Severe footing | A large amount |
| Comparative Example 6 | Severe footing | A large amount |

As shown in Table 3, when each composition for forming a resist underlayer film prepared in Example 1 to Example 10 was used, it was observed that a photoresist pattern having a good straight bottom shape was obtained. In addition, no residue of the resist underlayer film was observed.

By contrast, when each composition for forming a resist underlayer film prepared in Comparative Example 1 and Comparative Example 3 was used, the resist underlayer film was not developed and residues were left. This is supposed to be because the resist underlayer film was exposed to a solvent when a photoresist was applied on the film, then the resist underlayer film was impregnated with the solvent, and a photoacid generator component in the resist underlayer film was eluted.

When the composition for forming a resist underlayer film prepared in Comparative Example 2 was used, no pattern was formed. This is supposed to be because the resist underlayer film was exposed to a solvent when a photoresist was applied on the film, then the resist underlayer film was impregnated with the solvent, and a photoacid generator component in the resist underlayer film was eluted.

When each composition for forming a resist underlayer film prepared in Comparative Example 4, Comparative Example 5, and Comparative Example 6 was used, the resist underlayer film was not developed and residues were left. This is supposed to be because the resist underlayer film included insufficient area soluble in an alkali developer and thus the resist underlayer film had poor solubility in the alkali developer.

INDUSTRIAL APPLICABILITY

The present invention can provide a composition for forming a resist underlayer film in order to form a resist underlayer film that does not elute a photoacid generator in the resist underlayer film into a solvent in an overcoating photoresist, that is alkali-developed concurrently with the alkali-development of a photoresist film, and that is removed concurrently with the photoresist film. The composition for forming a resist underlayer film of the present invention is useful as a composition for forming a resist underlayer film for microfabrication in a lithography process employing an ArF excimer laser and a KrF excimer laser as irradiation light.

The invention claimed is:

1. A method for forming a photoresist pattern to be used in a production of a semiconductor device, the method comprising:
    applying a composition for forming a resist underlayer film on a semiconductor substrate followed by baking to form a resist underlayer film;
    forming a photoresist film on the resist underlayer film;
    exposing the semiconductor substrate coated with the resist underlayer film and the photoresist film; and
    developing the photoresist film and the resist underlayer film after the exposure to be removed concurrently without dry etching,
    wherein the composition for forming a resist underlayer film comprises:
        a polymer (A) containing unit structures of Formula (1), Formula (2), and Formula (3):

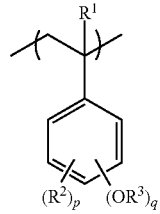

Formula (1)

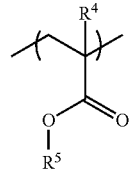

Formula (2)

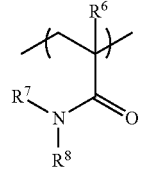

Formula (3)

wherein in above Formula (1), Formula (2), and Formula (3), each of $R^1$, $R^4$ and $R^6$ is a hydrogen atom or a methyl group; in Formula (1), $R^2$ is a monovalent organic group, $R^3$ is a hydrogen atom or a $C_{1-12}$ alkyl group or acyl group, p is an integer of 0 to 3, q is an integer of 1 to 3, and (p+q) is an integer of 1 to 5; in Formula (2), $R^5$ is an acid-cleavable group; and in Formula (3), each of $R^7$ and $R^8$ is independently a hydrogen atom, or a substituted or unsubstituted $C_{1-12}$ alkyl group, or $R^7$ and $R^8$ are bonded to each other to form, together with a nitrogen atom bonded thereto, a group having a three- to fifteen-membered ring structure, and $R^7$ and $R^8$ are not a hydrogen atom at the same time; the polymer (A) being a polymer in which the unit structure of Formula (1) has a ratio of mole number (a) within a range of 0.20≤a≤0.90, the unit structure of Formula (2) has a ratio of mole number (b) with a range of 0.05≤b≤0.06, and the unit structure of Formula (3) has a ratio of mole number (c) within a range of 0.001≤c≤0.40, when a total mole number of all unit structures constituting the polymer is 1.0, and the polymer (A) having a weight average molecular weight of 3,000 to 100,000;

a crosslinkable compound (D) being a compound of Formula (4):

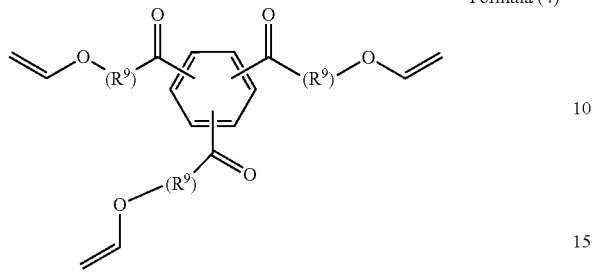

Formula (4)

wherein in Formula (4), $R^9$ is a *—$(CH_2)nO$— group or a *—$(CH_2O)n$- group (where the linkage with * is bonded to an ether moiety), and n is an integer of 1 to 10;

a photoacid generator (E);

a solvent (F); and a basic compound (G), wherein the crosslinkable compound (D) is used in an amount ranging from 10% by mass to 70% by mass based on the total mass of the polymer (A), and the composition includes 0.001 to 5 parts by mass of the basic compound (G) with respect to 100 parts by mass of the polymer (A).

2. A method for forming a photoresist pattern to be used in a production of a semiconductor device, the method comprising:

applying a composition for forming a resist underlayer film on a semiconductor substrate followed by baking to form a resist underlayer film;

forming a photoresist film on the resist underlayer film;

exposing the semiconductor substrate coated with the resist underlayer film and the photoresist film; and developing the photoresist film and the resist underlayer film after the exposure to be removed concurrently without dry etching, wherein the composition for forming a resist underlayer film comprises:

a polymer (B) containing unit structures of Formula (1) and Formula (2):

Formula (1)

Formula (2)

wherein in above Formula (1) and Formula (2), each of $R^1$ and $R^4$ is a hydrogen atom or a methyl group; in Formula (1), $R^2$ is a monovalent organic group, $R^3$ is a hydrogen atom or a $C_{1-12}$ alkyl group or acyl group, p is an integer of 0 to 3, q is an integer of 1 to 3, and (p+q) is an integer of 1 to 5; and in Formula (2), $R^5$ is an acid-cleavable group); the polymer (B) being a polymer in which the unit structure of Formula (1) has a ratio of mole number (a) within a range of $0.20 \leq a \leq 0.90$, and the unit structure of Formula (2) has a ratio of mole number (b) within a range of $0.05 \leq b \leq 0.6$, when a total mole number of all unit structures constituting the polymer is 1.0, and the polymer (B) having a weight average molecular weight of 3,000 to 100,000;

a polymer (C) containing unit structures of Formula (1) and Formula (3):

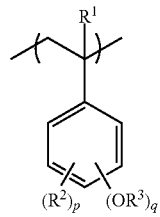

Formula (1)

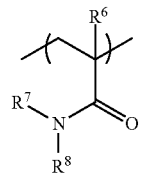

Formula (3)

wherein in above Formula (1) and Formula (3), each of $R^1$ and $R^6$ is a hydrogen atom or a methyl group; in Formula (1), $R^2$ is a monovalent organic group, $R^3$ is a hydrogen atom or a $C_{1-12}$ alkyl group or acyl group, q is an integer of 1 to 3, p is an integer of 0 to 3, and (p+q) is an integer of 1 to 5; and in Formula (3), each of $R^7$ and $R^8$ is independently a hydrogen atom, or a substituted or unsubstituted $C_{1-12}$ alkyl group, or $R^7$ and $R^8$ are bonded to each other to form, together with a nitrogen atom bonded thereto, a group having a three- to fifteen-membered ring structure, and $R^7$ and $R^8$ are not a hydrogen atom at the same time; the polymer (C) being a polymer in which the unit structure of Formula (1) has a ratio of mole number (a) within a range of $0.20 \leq a \leq 0.90$, and the unit structure of Formula (3) has a ratio of mole number (c) within a range of $0.001 \leq c \leq 0.40$, when a total mole number of all unit structures constituting the polymer is 1.0, and the polymer (C) having a weight average molecular weight of 3,000 to 100,000;

a crosslinkable compound (D) being a compound of Formula (4):

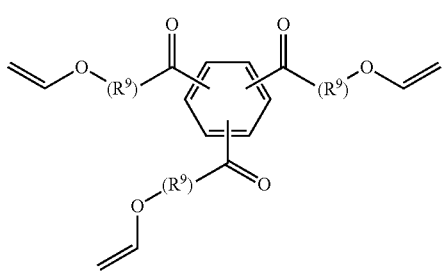

Formula (4)

wherein in Formula (4), $R^9$ is a *—$(CH_2)nO$— group or a *—$(CH_2O)n$- group (where the linkage with * is bonded to an ether moiety), and n is an integer of 1 to 10;

a photoacid generator (E);

a solvent (F); and a basic compound (G), wherein a ratio of the polymer (B) and the polymer (C) is 1:0.01 to 1:1 by weight, the crosslinkable compound (D) is used in an amount ranging from 10% by mass to 70% by mass based on the total mass of the polymer (B) and the polymer (C), and the composition includes 0.001 to 5 parts by mass of the basic compound (G) with respect to 100 parts by mass in a total mass of the polymer (B) and the polymer (C).

* * * * *